(12) United States Patent
Lee

(10) Patent No.: US 6,222,270 B1
(45) Date of Patent: Apr. 24, 2001

(54) INTEGRATED CIRCUIT BONDING PADS INCLUDING CLOSED VIAS AND CLOSED CONDUCTIVE PATTERNS

(75) Inventor: Hyae-ryoung Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/103,970

(22) Filed: Jun. 24, 1998

(30) Foreign Application Priority Data

Jun. 24, 1997 (KR) .................................................. 97-26746

(51) Int. Cl.[7] ........................... H01L 23/48; H01L 23/52; H01L 29/40
(52) U.S. Cl. ........................... 257/758; 257/773; 257/786
(58) Field of Search ................................. 257/786, 780, 257/781, 758, 773

(56) References Cited

U.S. PATENT DOCUMENTS

| | | | |
|---|---|---|---|
| 5,084,752 | 1/1992 | Satoh et al. | 357/68 |
| 5,248,903 | * 9/1993 | Heim . | |
| 5,403,777 | 4/1995 | Bryant et al. | 437/183 |
| 5,502,337 | 3/1996 | Nozaki | 257/773 |
| 5,528,061 | * 6/1996 | Iwasaki et al. . | |
| 5,691,574 | * 11/1997 | Suzuki . | |
| 5,700,735 | 12/1997 | Shiue et al. | 438/612 |
| 5,707,894 | 1/1998 | Hsiao | 437/209 |
| 5,736,791 | 4/1998 | Fujiki et al. | 257/781 |
| 5,959,357 | * 9/1999 | Korman . | |
| 5,986,343 | * 11/1999 | Chittipeddi et al. . | |
| 6,040,604 | * 3/2000 | Lauvray et al. . | |

* cited by examiner

*Primary Examiner*—Sheila V. Clark
(74) *Attorney, Agent, or Firm*—Myers Bigel Sibley & Sajovec

(57) ABSTRACT

Multilayer bonding pads for integrated circuits include first and second spaced apart conductive patterns and a dielectric layer therebetween. A closed conductive pattern is included in the dielectric layer that electrically connects the first and second spaced apart patterns. The closed conductive pattern encloses an inner portion of the dielectric layer and is enclosed by an outer portion of the dielectric layer. The closed conductive pattern may be a circular, elliptical, polygonal or other conductive pattern. A second closed conductive pattern may also be included in the inner portion of the dielectric layer, electrically connecting the first and second spaced apart conductive patterns. An open conductive pattern having end points, may also be included in the dielectric layer. The open conductive pattern may be included in the inner portion of the dielectric layer, in the outer portion of the dielectric layer or both. Bonding pads may be formed by forming a dielectric layer on an integrated circuit substrate, the dielectric layer including the closed via therein that encloses an inner portion of the dielectric layer and is enclosed by an outer portion of the dielectric layer. A conductive pattern is formed in the closed via and on the dielectric layer opposite the substrate. The conductive pattern preferably fills the closed via. The steps of forming a dielectric layer and forming a conductive pattern may be repeatedly performed, to form a multilayer bonding pad on the integrated circuit substrate.

36 Claims, 11 Drawing Sheets

INTEGRATED CIRCUIT BONDING PADS INCLUDING CLOSED VIAS AND CLOSED CONDUCTIVE PATTERNS

FIELD OF THE INVENTION

This invention relates to integrated circuits and methods of forming the same, and more particularly to bonding pads for integrated circuits and methods of forming the same.

BACKGROUND OF THE INVENTION

Integrated circuits, also referred to as "chips", are widely used in consumer and commercial electronic products. As is well known to those having skill in the art, an integrated circuit generally includes a substrate such as a semiconductor substrate and an array of bonding pads on the substrate. The bonding pads provide an electrical connection from outside the integrated circuit to microelectronic circuits in the integrated circuit.

In the design of high performance integrated circuits, it is generally desirable to provide a low electrical resistance in the bonding pads. Unfortunately, as the integration density of integrated circuits continues to increase, more bonding pads may be needed in the integrated circuit, so that the area of each bonding pad may be lowered. Unfortunately, as the bonding pad becomes smaller, the resistance thereof may increase.

Moreover, as the integrated circuit device becomes more highly integrated, a step between the bonding pad and an insulating layer around the bonding pad may be produced. Reaction residue that is generated during a process of forming a contact hole on the insulating layer in order to expose the bonding pad, may become stacked at the edge of the step. The reaction residue may increase the contact resistance of the bonding pad.

SUMMARY OF THE INVENTION

It is therefore an object of the present invention to provide improved bonding pads for integrated circuits and methods of forming the same.

It is another object of the present invention to provide bonding pads for integrated circuits that can have low contact resistance, and methods of forming the same.

These and other objects are provided, according to the present invention, by multilayer bonding pads for integrated circuits that include first and second spaced apart conductive patterns and a dielectric layer therebetween. A closed conductive pattern is included in the dielectric layer that electrically connects the first and second spaced apart patterns. The closed conductive pattern encloses an inner portion of the dielectric layer and is enclosed by an outer portion of the dielectric layer. As is well known to those having skill in the art, a closed pattern is a curve that has no end points. The closed conductive pattern may be a circular, elliptical, polygonal or other conductive pattern.

A second closed conductive pattern may also be included in the inner portion of the dielectric layer, electrically connecting the first and second spaced apart conductive patterns. An open conductive pattern having end points, may also be included in the dielectric layer. The open conductive pattern may be included in the inner portion of the dielectric layer, in the outer portion of the dielectric layer or both.

A third conductive pattern may also be provided that is spaced apart from the second conductive pattern. A second dielectric layer is included between the second and third conductive patterns, and a fourth conductive pattern is included in the dielectric layer, electrically connecting the second and third spaced apart conductive patterns. The fourth conductive pattern may be an open conductive pattern.

Alternatively, the fourth conductive pattern may comprise a second closed conductive pattern in the second dielectric layer, electrically connecting the second and third spaced apart conductive patterns. The second closed conductive pattern encloses a second inner portion of the second dielectric layer and is enclosed by a second outer portion of the second dielectric layer. The second dielectric layer may also include additional open and closed conductive patterns therein, electrically connecting the second and third spaced apart conductive patterns.

In a preferred embodiment, the second and third conductive patterns are congruent to one another, and the closed conductive pattern and the second closed conductive pattern are of the same shape but of different sizes. In another preferred embodiment, the closed conductive pattern is an elliptical conductive pattern and the second closed conductive pattern is a polygonal closed conductive pattern.

By connecting conductive layer patterns with a closed conductive pattern in the dielectric layer, a step between an exposed region of the conductive pad and a dielectric layer covering an edge of the pad may be reduced. Reaction residue can therefore be reduced or prevented from being stacked on the step. Stacked residue can also be easily removed, to thereby lower the contact resistance of the pad.

Bonding pads according to the present invention may also be thought of as including first and second spaced apart conductive patterns and a dielectric layer therebetween, the dielectric layer including a closed via therein that extends between the first and second spaced apart conductive patterns. The closed via encloses an inner portion of the dielectric layer and is enclosed by an outer portion of the dielectric layer. A closed conductive pattern is provided in the closed via, electrically connecting the first and second spaced apart conductive patterns. The closed conductive pattern preferably fills the closed via. Various forms of closed conductive patterns and combinations with open conductive patterns may be provided, as was described above.

Bonding pads according to the present invention are preferably included on an integrated circuit substrate, to provide improved integrated circuits. Bonding pads according to the present invention may be formed by forming a dielectric layer on an integrated circuit substrate, the dielectric layer including the closed via therein that encloses an inner portion of the dielectric layer and is enclosed by an outer portion of the dielectric layer. A conductive pattern is formed in the closed via and on the dielectric layer opposite the substrate. The conductive pattern preferably fills the closed via. The steps of forming a dielectric layer and forming a conductive pattern may be repeatedly performed, to form a multilayer bonding pad on the integrated circuit substrate. The closed vias may have various shapes and may be combined with open vias as was described above. Accordingly, high performance bonding pads, integrated circuits and forming methods may thereby be provided.

DETAILED DESCRIPTION OF PREFERRED EMBODIMENTS

Figure 1:
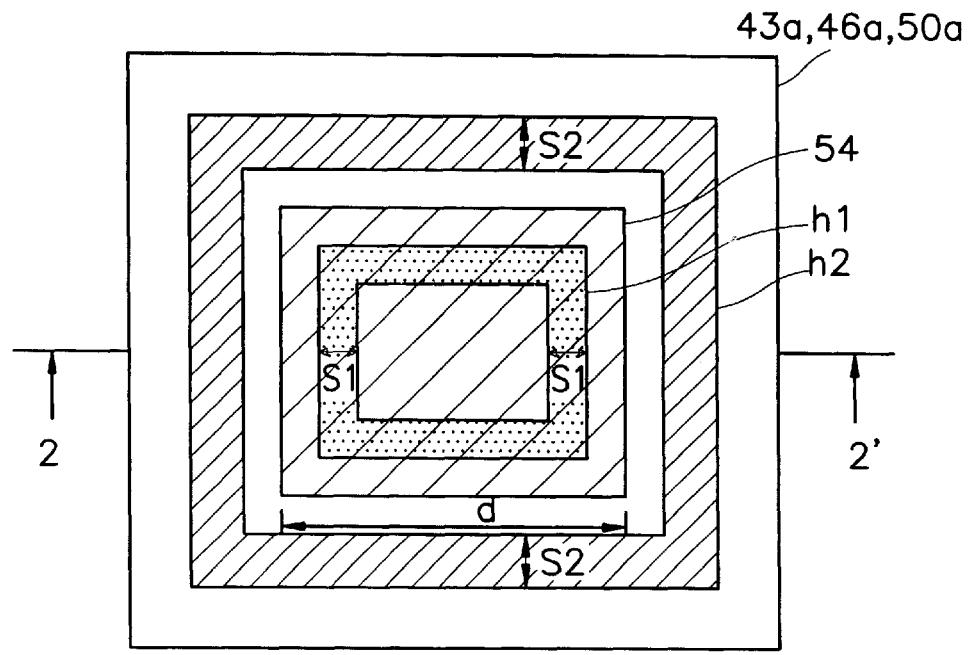
FIG. 1 is a plan view of an integrated circuit device having a multilayer conductive pad according to a first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present.

Referring to FIG. 1, reference numerals 43a, 46a and 50a denote first, second and third conductive layer patterns stacked in sequence on an integrated circuit substrate such as a semiconductor substrate, for forming a multilayer conductive pad. Reference numerals h1 and h2 denote first and second vias, also referred to as via holes, exposing the first and second conductive layer patterns 43a and 46a. The first and second via holes h1 and h2 are closed via holes. The first via hole h1 is a path connecting the first and second conductive layer patterns 43a and 46a, and the second via hole h2 is a path connecting the second conductive layer pattern 46a to the third conductive layer pattern 50a.

Reference numeral 54 denotes a pad window. The pad window 54 is a bonding area in which an external connection to an integrated circuit is made to the multilayer conductive pad. Preferably, the pad window 54 is wide enough to increase a bonding process margin. An edge boundary of the pad window 54 of FIG. 1 is disposed between the first and second via holes h1 and h2.

Reference character d denotes a width of the pad window 54. The widths s1 and s2 of the first and second via holes h1 and h2 may be the same or different from each other. Also, the widths of the first and second via holes h1 and h2 may be different per region on different sides thereof. For instance, the width of a portion of the first via hole h1 may be different from other portions thereof.

Figure 2:
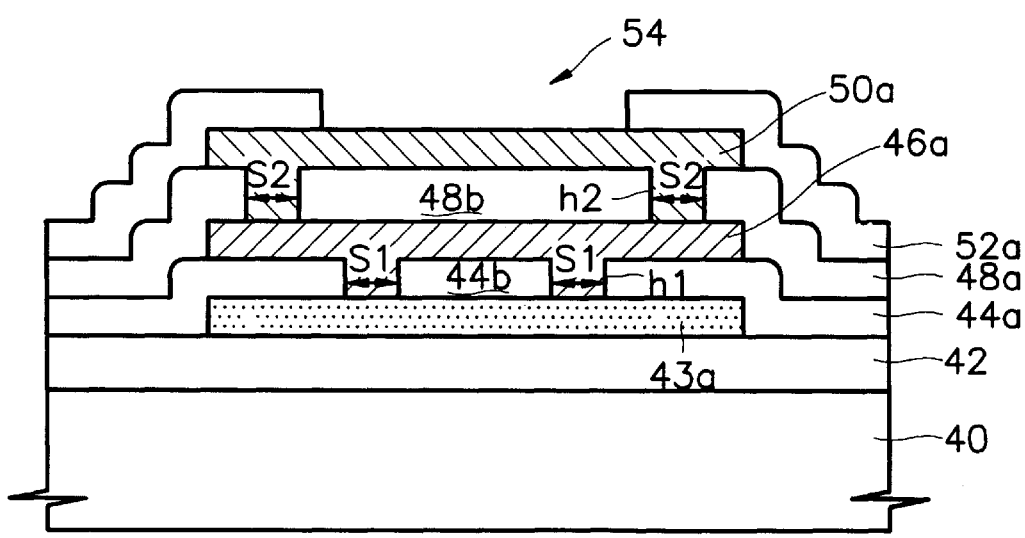
FIG. 2 is a sectional view of an integrated circuit device taken along the 2–2' direction of FIG. 1.

Referring to FIG. 2, a first dielectric layer 42, also referred to as an interdielectric layer, is formed on a semiconductor substrate 40, and a first conductive layer pattern 43a is formed on the first interdielectric layer 42. A second dielectric layer 44a, also referred to as a second dielectric layer, and a second interdielectric layer pattern 44b are formed on the first interdielectric layer 42 and the first conductive layer pattern 43a. A first via hole h1 exposing the first conductive layer pattern 43a is formed between the second interdielectric layer 44a and the second interdielectric layer pattern 44b. It is preferable that the width s1 of the first via hole h1 is uniform.

A second conductive layer pattern 46a, preferably filling the first via hole h1, is formed on the second interdielectric layer 44a and the second interdielectric layer pattern 44b. The width of the second conductive layer pattern 46a preferably is the same as that of the first conductive layer pattern 43a.

In FIG. 2, the second conductive layer pattern 46a completely overlaps the first conductive layer pattern 43a, i.e. it is congruent thereto. However, the second conductive layer pattern 46a may partially overlap the first conductive layer pattern 43a.

The first via hole h1 is filled with a conductive plug such as a tungsten plug, and a conductive layer may exist on the entire surface of the resultant structure. The third interdielectric layer 48a and the third interdielectric layer pattern 48b are formed on the second interdielectric layer 44a and the second conductive layer pattern 46a . Also, the second via hole h2 exposing the second conductive layer pattern 46a is formed between the third interdielectric layer 48a and the third interdielectric layer pattern 48b. The third interdielectric layer 48a and the third interdielectric layer pattern 48b are separated from each other by a width s2 of the second via hole h2. It is preferable that the width s2 of the second via hole h2 is the same as the width s1 of the first via hole h1. The third interdielectric layer pattern 48b is preferably larger than the second interdielectric layer pattern 44b. The area of the third interdielectric layer pattern 48b may have an arbitrary value within the second conductive layer pattern 46a. A third conductive layer pattern 50a connected to the second conductive layer pattern 46a through the second via hole h2 is formed on the third interdielectric layer 48a and the third interdielectric layer pattern 48b.

The second via hole h2 is filled with a conductive plug such as a tungsten plug, and a conductive layer may be formed on the entire surface of the third interdielectric layer 48a, the third interdielectric layer pattern 48b and the conductive plug. Preferably, the thicknesses of the first through third conductive layer patterns 43a, 46a and 50a are the same. An upper insulating layer 52a having a pad window 54 exposing the third conductive layer pattern 50a is formed on the third interdielectric layer 48a. Preferably, the pad window 54 is smaller than the third interdielectric layer pattern 48b, and larger than the second interdielectric layer pattern 44b.

As described above, if desired, various types of via holes, for instance, closed or open via holes may be further formed in the second and third interdielectric layers 44a and 48a or the second and third interdielectric layer patterns 44b and 48b.

Various closed or open via holes may be formed in an arbitrarily selected interdielectric layer. The shape of the closed via hole may be circular, elliptical or polygonal.

The various closed holes may be formed independently or overlapping with each other in the second or third interdielectric layer 44a and 48a. Also, open via holes may be formed independently or together with the closed via hole in the second and third interdielectric layers 44a and 48a.

The shape of the via holes formed in the second and third interdielectric layers 44a and 48a will now be described. More specifically, the plane forms of the interdielectric layer patterns surrounded by the closed via holes will be described.

Figure 3:
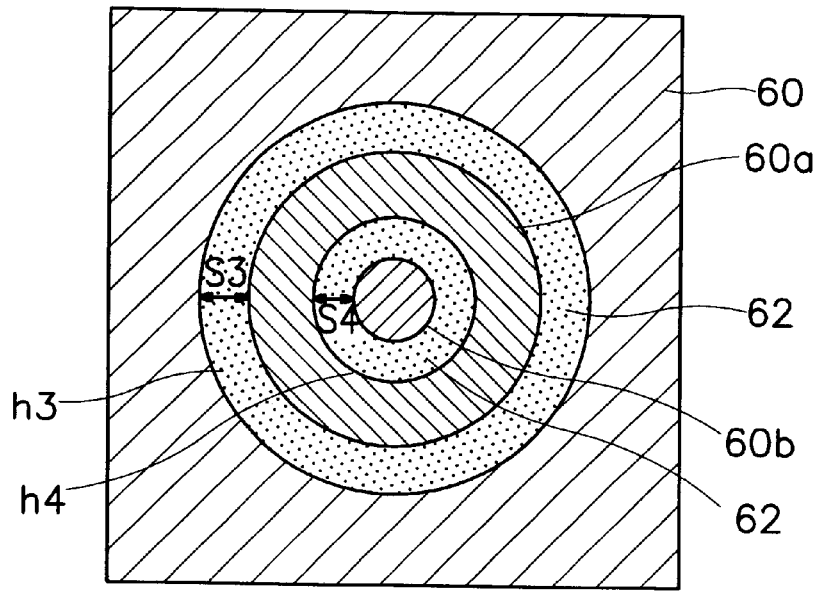
FIGS. 3 through 7 are plan views of various closed type via holes of the first embodiment of the present invention.

Referring to FIG. 3, an interdielectric layer pattern 60a is formed in an interdielectric layer 60. The shape of the interdielectric layer pattern 60a is a circle. A third closed via hole h3 is formed between the interdielectric layer 60 and the interdielectric layer pattern 60a. A width s3 of the third closed via hole h3 indicates a distance between the interdielectric layer pattern 60a and the interdielectric layer 60. A conductive material 62 filling the third closed via hole h3 contacts conductive layers formed on and under the interdielectric layer 60. An interdielectric layer pattern 60b is formed in the interdielectric layer pattern 60a. The interdielectric layer pattern 60b is surrounded by a fourth closed via hole h4. A width s4 of the fourth closed via hole h4 indicates a distance between the interdielectric layer patterns 60a and 60b. It is preferable that the widths s3 and s4 of the third and fourth closed via holes h3 and h4 are the same.

Figure 4:
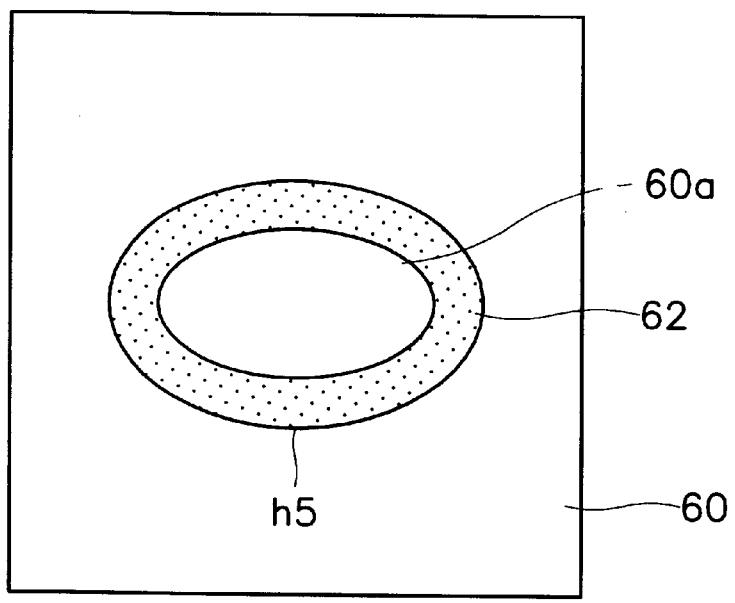
Figure 5:
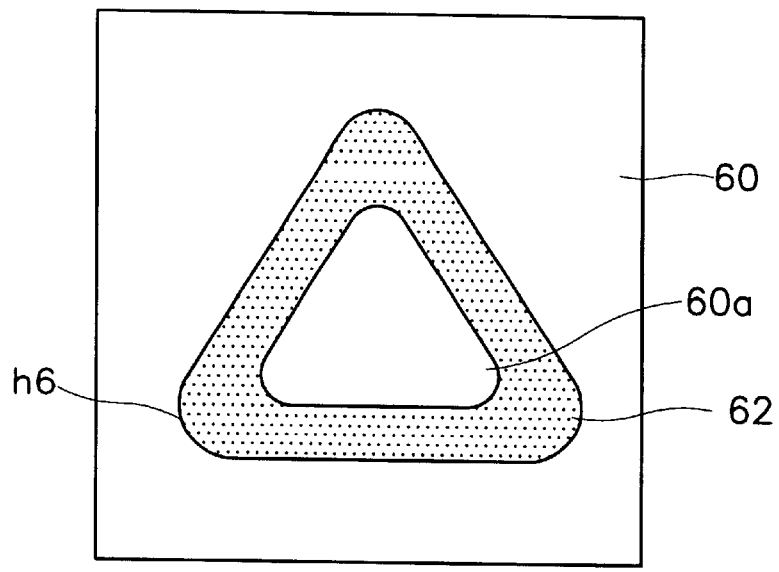
Figure 6:
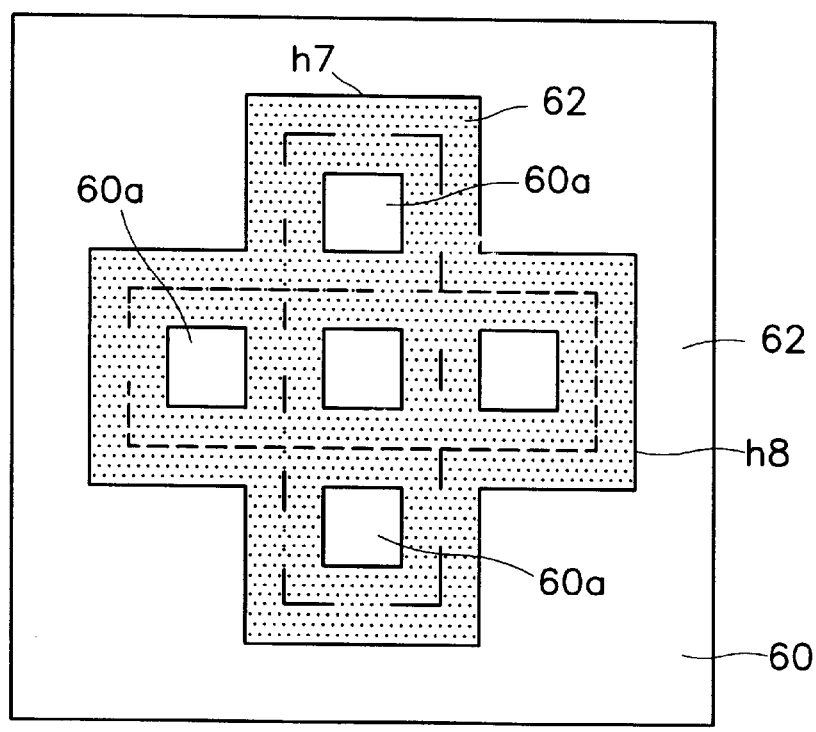
Figure 7:
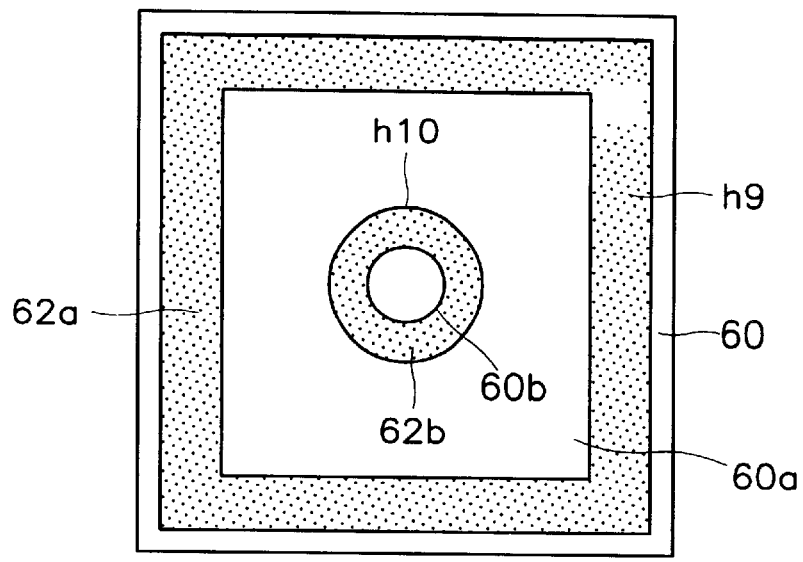

Other shapes of closed via holes may be provided. For example, an elliptical formed closed via hole h5 is shown in FIG. 4. A triangular closed via hole h6 is shown in FIG. 5. A closed via hole h7 obtained by intersecting two rectangular closed via holes may be formed in the interdielectric layer 60 as shown in FIG. 6. Also, as shown in FIG. 7, two different closed via holes, for instance, a rectangular closed via hole h9 and a circular closed via hole h10, may be formed in the interdielectric layer 60.

Figure 8:
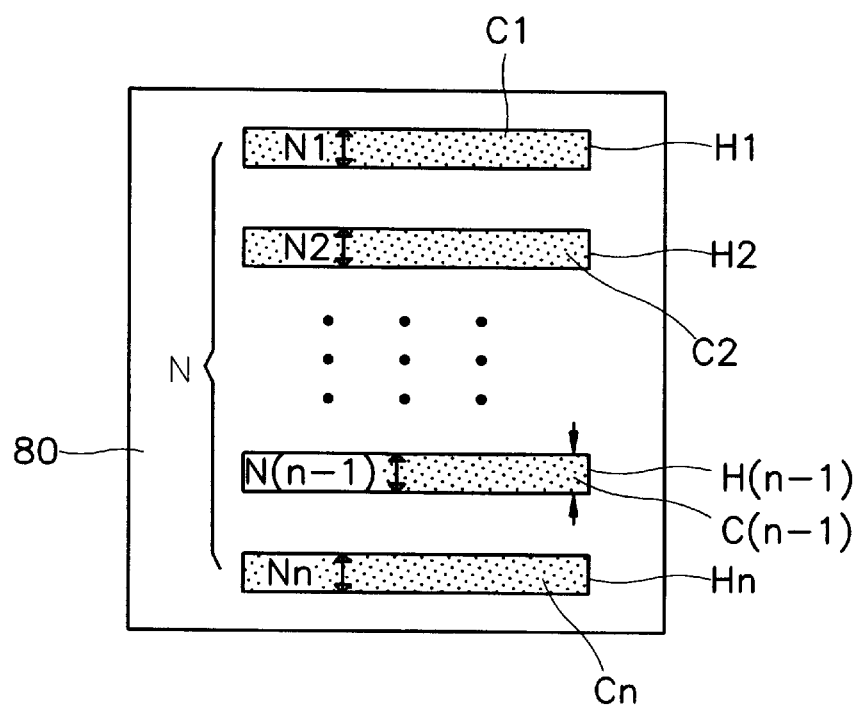
FIGS. 8 through 13 are plan views of an integrated circuit device having a multilayer conductive pad according to a second embodiment of the present invention.

Referring to FIG. 8, N linear open via holes H1, H2, ..., H(n-1), Hn extend parallel with each other in an interdielectric layer 80. The lengths of the open via holes are preferably the same. Also, it is preferable that the widths N1, N2, ..., N(n-1), Nn of the open via holes H1, H2, ..., H(n-1), Hn are the same. The open via holes H1, H2, ..., H(n-1), Hn may be filled with conductive materials C1, C2, ... C(n-1), Cn. It is preferable that the conductive materials C1, C2, ..., C(n-1), Cn are the same.

In FIG. 8, it is preferable that the open via holes H1, H2, ..., H(n-1), Hn are arranged in the longitudinal direction. Also, intervals among the open via holes H1, H2, ..., H(n-1), Hn may be the same or different.

Figure 9:
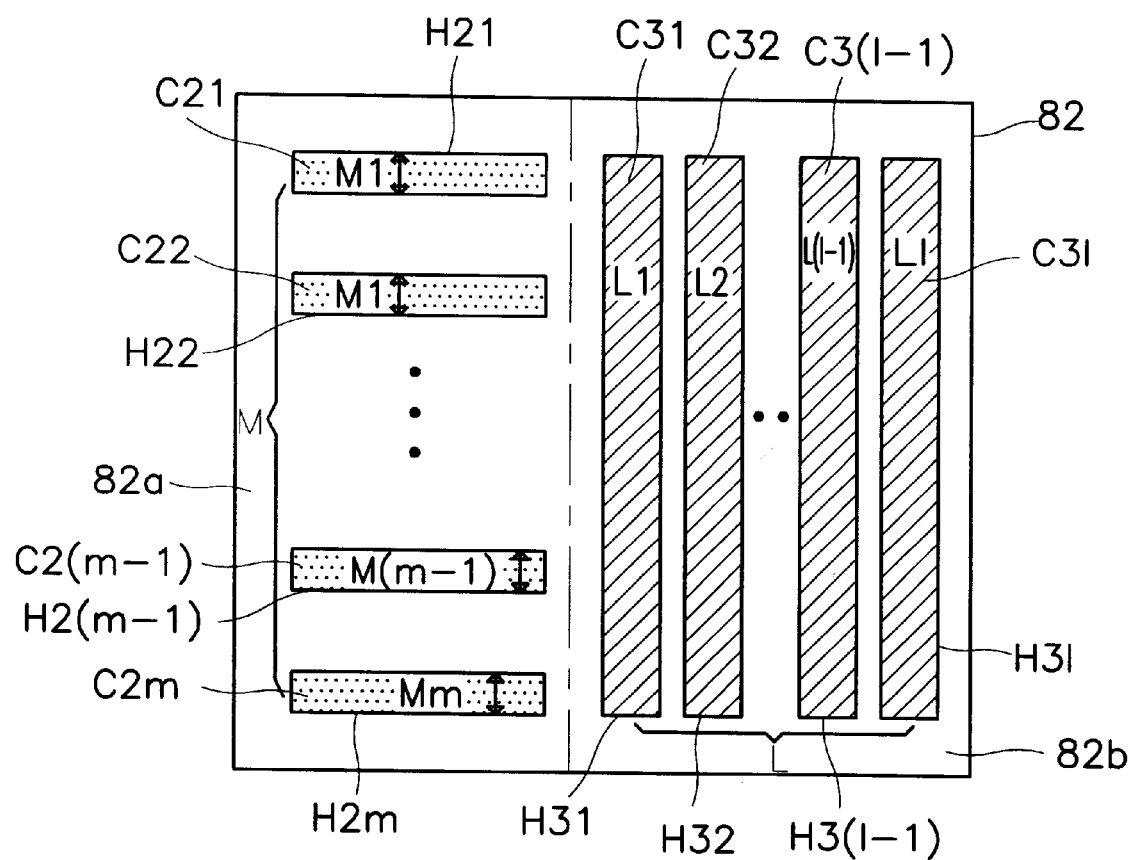

Referring to FIG. 9, an interdielectric layer 82 is divided into first and second regions 82a and 82b. M linear open via holes H21, H22, ..., H2(m-1), H2m of the first region 82a are in the longitudinal direction. L linear open via holes H31, H32, ..., H3(l-1), H3l of the second region 82b are arranged in the latitudinal direction. It is preferable that lengths of the open via holes H21, H22, ..., H2(m-1), H2m arranged in the first region 82a are the same. The widths M1, M2, ..., M(m-1), Mm of the open via holes H21, H22, ..., H2(m-1), H2m of the first region 82a may be different. Preferably, intervals among the open via holes H21, H22, ..., H2(m-1), H2m of the first region 82a are the same.

M open via holes H21, H22, ..., H2(m-1), H2m arranged on the first region 82a are filled with conductive materials C21, C22, ..., C2(m-1), C2m. Open via holes H31, H32, ..., H3(l-1), H3l of the second region 82b are also filled with conductive materials. Reference numerals L1, L2, ..., L(l-1), Ll of the second region 82b denote widths of the open via holes H31, H32, ..., H3(l-1), H3l, respectively. Also, reference numerals C31, C32, ..., C3(l-1), C3l denote conductive materials filling the open via holes H31, H32, ..., H3(l-1), H3l of the second region 82b, respectively.

Preferably, the conductive materials C21, C22, ..., C2(m-1), C2m filling the open via holes H21, H22, ..., H2(m-1), H2m arranged on the first region 82a and the conductive materials C31, C32, ..., C3(l-1), C3l filling the open via holes H31, H32, ..., H3(l-1), H3l arranged on the second region 82b are the same. Also, the lengths of the open via holes H21, H22, ..., H2(m-1), H2m arranged on the first region 82a may be different from those of the open via holes H31, H32, ..., H3(l-1), H3l arranged on the second region 82b.

Figure 10:
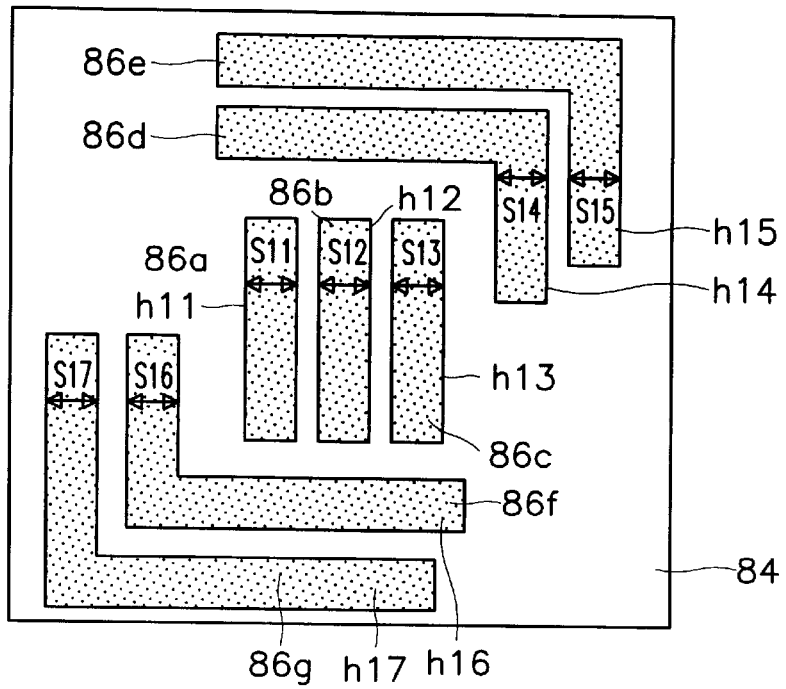

Referring to FIG. 10, first through third open via holes serially arranged in the latitudinal direction and having a predetermined length in the longitudinal direction are formed in the center of an interdielectric layer 84. The lengths of the first through third open via holes h11, h12 and h13 are preferably the same. The widths s11, s12 and s13 of the first through third open via holes h11, h12 and h13 also preferably are the same. The first through third open via holes h11, h12 and h13 are filled with conductive materials 86a, 86b and 86c. Fourth and fifth open via holes h14 and h15 are arranged in the right upper portion of the interdielectric layer 84. Each of the fourth and fifth open via holes h14 and h15 includes horizontal and vertical components, where the horizontal components of the fourth and fifth open via holes h14 and h15 are parallel with each other and the vertical components thereof are parallel with each other. The widths s14 and s15 of the fourth and fifth open via holes h14 and h15 preferably are the same. In another embodiment, the widths of the horizontal and vertical components of the fourth and fifth open via holes h14 and h15 may be different from each other.

Sixth and seventh open via holes h16 and h17 are arranged in the left lower portion of the interdielectric layer 84. The sixth and seventh open via holes h16 and h17 preferably have the same structure as the fourth and fifth open via holes h14 and h15 except that longitudinal components may differ. It is preferable that the widths s11, ..., s17 of the first through seventh open via holes h11, ..., h17 are the same.

In FIG. 10, reference numerals 86d, 86e, 86f and 86g denote conductive materials filling the fourth through seventh open via holes h14, h15, h16 and h17, respectively.

Figure 11:
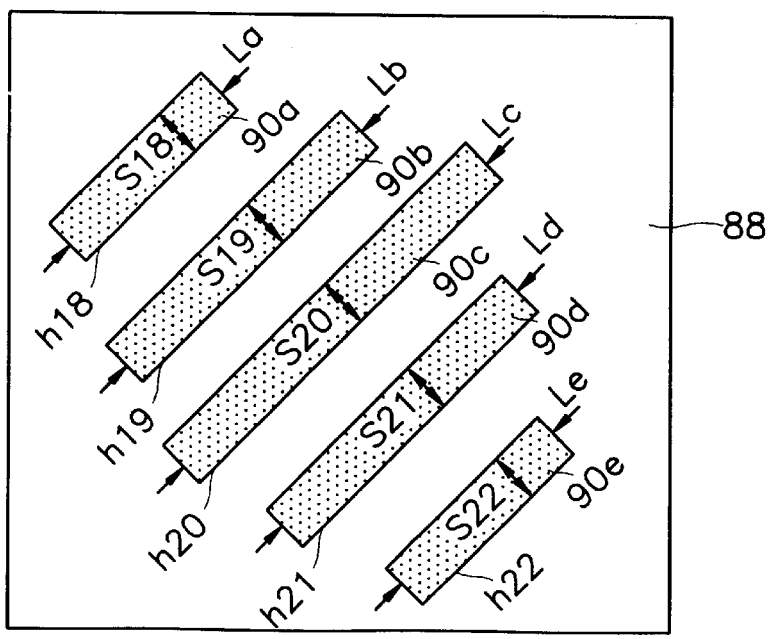

Referring to FIG. 11, a plurality of open via holes, for example first through fifth open via holes h18, h19, h20, h21 and h22 serially and diagonally arranged in an interdielectric layer 88. The widths s18, s19, s20, s21 and s22 and lengths La, Lb, Lc, Ld and Le of the first through fifth open via holes h18, h19, h120, h121 and h22 preferably are the same. However, other embodiments may have different widths and lengths. The first through fifth open via holes h18, h19, h20, h21 and h22 are arranged in the diagonal direction. The characteristics of the first through fifth open via holes h18, h19, h20, h21 and h22 may differ. The widths of the first through fifth open via holes h18, h19, h20, h21 and h22 are preferably the same. However, the widths also may be different from each other.

Figure 12:
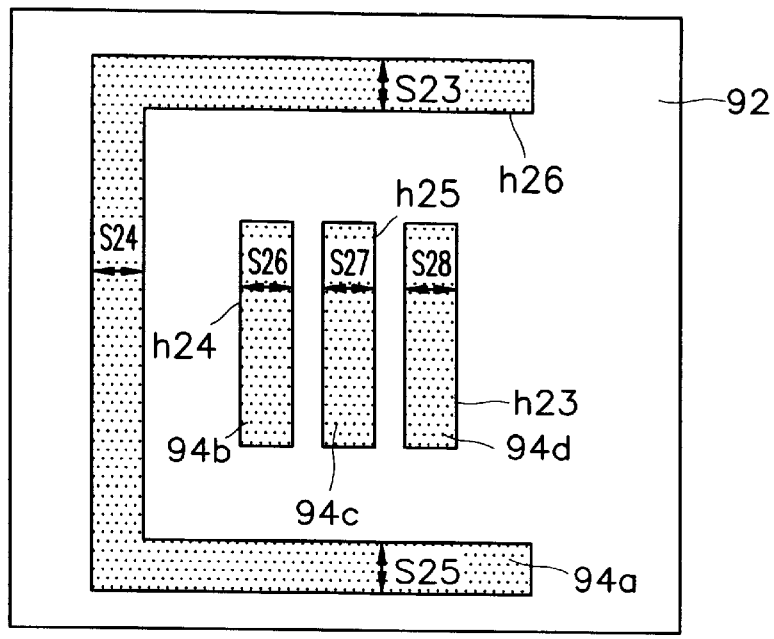
Figure 13:
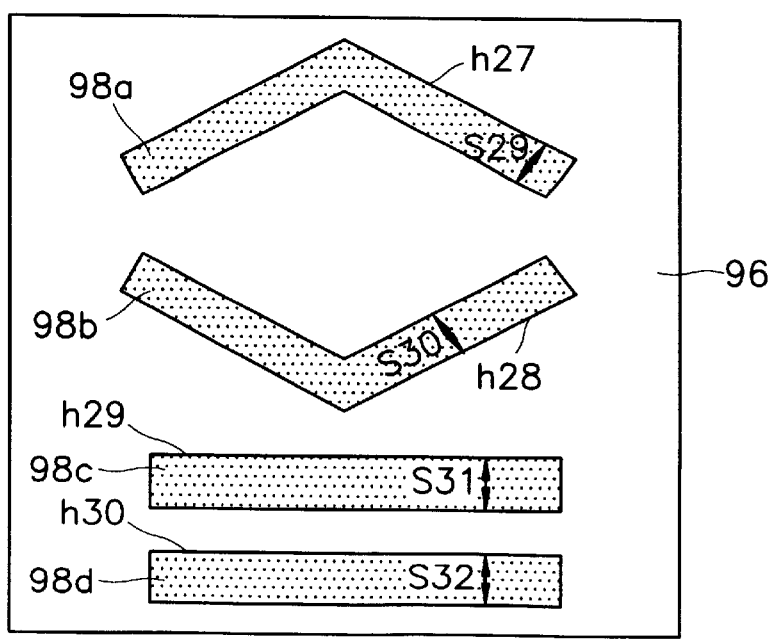

FIGS. 12 and 13 is plan views presenting embodiments in which open via holes of different forms exist together.

Referring to FIG. 12, a plurality of open via holes, for example first through third linear open via holes h23, h24, and h25 having a predetermined latitudinal length are arranged parallel with each other in the center of the interdielectric layer 92. The horizontal widths s26, s27 and s28 of the first through third open via holes h23, h24 and h25 preferably are the same. Also, intervals among the first through third open via holes h23, h24 and h25 preferably are also the same. The first through third open via holes h23, h24 and h25 are filled with conductive materials 94b, 94c and 94d. A fourth open via hole h26, having a predetermined width, surrounding the first through third open via holes h23, h24 and h25 is also formed in an interdielectric layer 92.

The fourth open via hole h26 includes a longitudinal component and two latitudinal components connected to both ends of the longitudinal component. As a result, the fourth open via hole h26 is positioned independently from the first through third open via holes h23, h24 and h25. The fourth open via hole h26 is filled with a conductive material 94a. The latitudinal and longitudinal widths s23, s24 and s25 of the fourth open via hole h26 are the same. Also, it is preferable that the widths of the first through third open via holes h23, h24 and h25 are equivalent to that of the fourth open via hole h26.

Referring to FIG. 13, first and second open via holes h27 and h28 are symmetrically provided in a predetermined region of an interdielectric layer 96. The first and second open via holes h27 and h28 have a bent point, respectively. The widths s29 and s30 of the first and second open via holes h27 and h28 preferably are the same. However, the widths s29 and s30 of the first and second open via holes h27 and h28 may be different from each other. The first and second open via holes h27 and h28 are filled with conductive materials 98a and 98b.

The third and fourth open via holes h29 and h30 having a predetermined latitudinal length, are arranged under the first and second open via holes h27 and h28 of the interdielectric layer 96. The third and fourth open via holes h29 and h30 are arranged independently from the first and second open via holes h27 and h28. The widths s31 and s32 and lengths of the third and fourth open via holes h29 and h30 preferably are the same. In other embodiments, the widths s31 and s32 of the third and fourth open via holes h29 and h30 may be different from each other.

The third and fourth open via holes h29 and h30 which are shown parallel with each other, may also have a predetermined angle therebetween. Also, the third and fourth open via holes h29 and h30 may be arranged in the longitudinal or diagonal direction. The position of the first and second open via holes h27 and h28 may be changed to that of the third and fourth open via holes h29 and h30. The third and fourth open via holes h29 and h30 are filled with conductive materials 98c and 98d.

Figure 14:
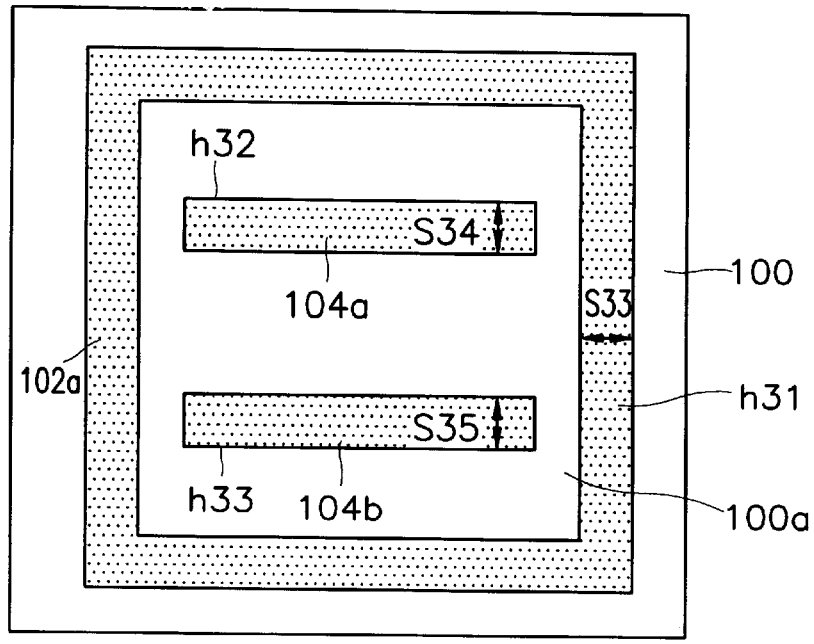
FIGS. 14 through 16 are plan views of an integrated circuit device having a multilayer conductive pad according to a third embodiment of the present invention.

FIG. 14 is a plan view illustrating an embodiment in which a closed via hole and an open via hole exist together. Referring to FIG. 14, an interdielectric layer pattern 100a is formed in an interdielectric layer 100. A closed via hole h31 of a predetermined width s33 surrounding the interdielectric layer pattern 100a is positioned between the interdielectric layer 100 and the interdielectric layer pattern 100a. The width s33 of the closed via hole h31 preferably is uniform. However, in other embodiments, the width s31 of the closed via hole h31 may be different. The closed via hole h31 is filled with a conductive material 102a contacting conductive layer patterns formed on and under the interdielectric layer 100.

Also, the first and second open via holes h32 and h33 are formed in the interdielectric layer pattern 100a. The first and second open via holes h32 and h33 extend latitudinally, and have predetermined widths s34 and s35 in the longitudinal direction. The first and second open via holes h32 and h33 may extend latitudinally within the interdielectric layer pattern 100a. The lengths of the first and second open via holes h32 and h33 preferably are the same. It is also preferable that the widths s34 and s35 of the first and second open via holes h32 and h33 are the same. The first and second open via holes h32 and h33 are filled with conductive materials 104a and 104b.

In other embodiments, the first and second open via holes h32 and h33 extend latitudinally and parallel with each other arranged in the interdielectric layer pattern 100a. Also, the first and second open via holes h32 and h33 may be arranged in the diagonal direction of the interdielectric layer pattern 100a. In this case, the lengths of the first and second open via holes h32 and h33 preferably are different from each other. Also, the positions of the closed via hole h31 and the first and second open via holes h32 and h33 may be changed relative to each other. That is, the first and second open via holes h32 and h33 may be positioned outside the closed via hole h31.

Figure 15:
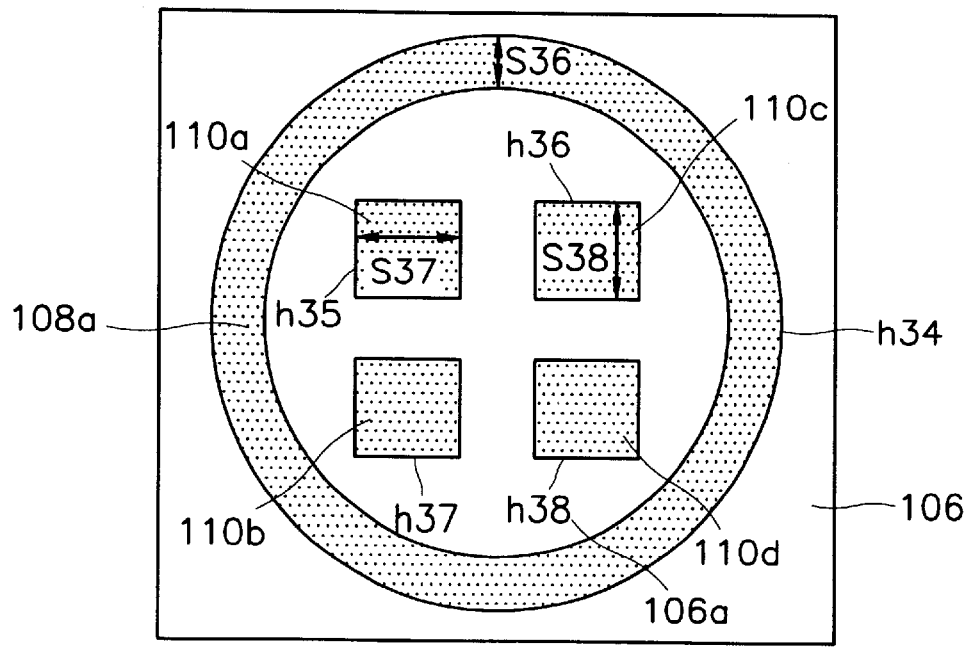

Referring to FIG. 15, an interdielectric layer pattern 106a is formed in an interdielectric layer 106. A closed via hole h34 surrounding the interdielectric layer pattern 106a and having a predetermined width s36, is disposed between the interdielectric layer 106 and the interdielectric layer pattern 106a. The width s36 of the closed via hole h34 preferably is uniform. The closed via hole h34 is filled with a conductive material 108a contacting a conductive layer pattern formed on and under the interdielectric layer 106.

First through fourth open via holes h35, h36, h37 and h38 are formed in the interdielectric layer pattern 106a. The first through fourth via holes h35, h36, h37 and h38 are square. The first through fourth open via holes h35, h36, h37 and h38 formed in the interdielectric layer pattern 106a also are arranged in the form of a square. The first through fourth open via holes h35, h36, h37 and h38 preferably are spaced apart from each other by the same interval in the latitudinal or longitudinal direction. The first through fourth open via holes h35, h36, h37 and h38 may be arranged in an arbitrary form instead of the form of a square. In other embodiments, the latitudinal and longitudinal widths s37 and s38 of the first through fourth open via holes h35, h36, h37 and h38 may be different. The first through fourth open via holes h35, h36, h37 and h38 preferably are filled with the same conductive materials 110a, 110b, 110c and 110d.

The positions of the first through fourth open via holes h35, h36, h37 and h38 may be changed relative to that of the closed via hole h34. That is, the first through fourth open via holes h35, h36, h37 and h38 may be formed in the interdielectric layer 106 outside the closed via hole h34.

Figure 16:
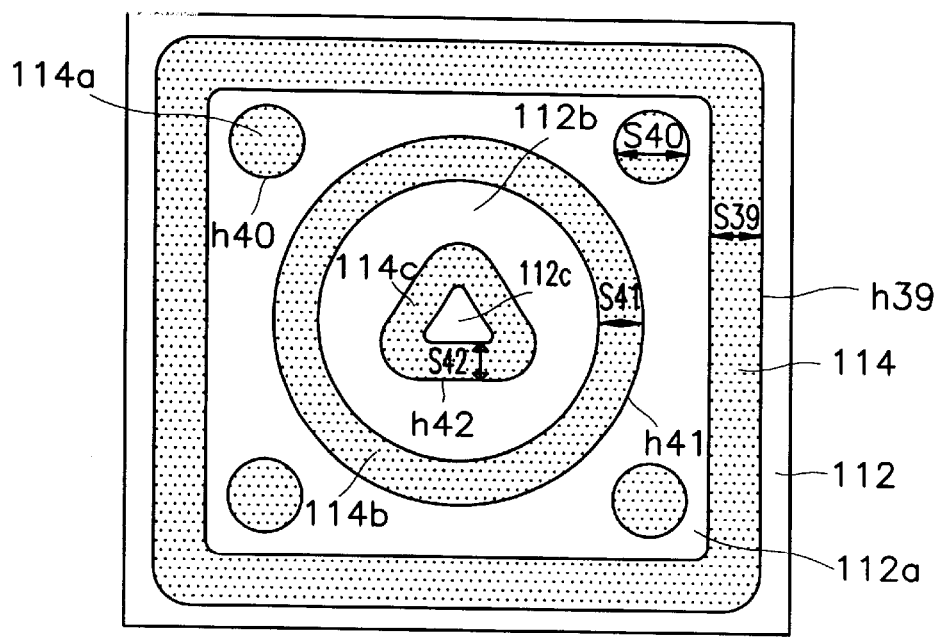

FIG. 16 is a plan view presenting an embodiment according to the present invention in which various closed and open via holes exist together in a interdielectric layer. Referring to FIG. 16, a first interdielectric layer pattern 112a is formed in an interdielectric layer 112. The shape of the first interdielectric layer pattern 112a is a rectangle, preferably a square. A first closed via hole h39 having a predetermined width s39 along the first interdielectric layer pattern 112a is disposed between the first interdielectric layer pattern 112a and the interdielectric layer 112. The interdielectric layer 112 and the first interdielectric layer pattern 112a are separated from each other by the width of the first closed via hole h39.

The width of the first closed via hole h39 preferably is uniform. The first closed via hole h39 is filled with a conductive material 114. A second interdielectric layer pattern 112b is formed in the first interdielectric layer pattern 112a The second interdielectric layer pattern 112b preferably is circular. Also, a second closed via hole h41 of a predetermined width s41 is between the first interdielectric layer pattern 112a and the second interdielectric layer pattern 112b. The second interdielectric layer pattern 112b is separated from the first interdielectric layer pattern 112a by the width s41 the second closed via hole h41. A width s41 of the second closed via hole h41 along the second interdielectric layer pattern 112b preferably is uniform.

The second closed via hole h41 is filled with a conductive material 114b. It is preferable that the conductive material 114b is the same as the conductive material 114 filling the first closed via hole h39.

A third interdielectric layer pattern 112c is formed in the second interdielectric layer pattern 112b. The shape of the third interdielectric layer pattern 112c is a triangle. A third closed via hole h42 of a predetermined width s42 surrounds the closed surface of the third interdielectric layer pattern 112c. The third interdielectric layer pattern 112c is separated from the second interdielectric layer pattern 112b by the width s42 of the third closed via hole h42. The width s42 of the third closed via hole h42 preferably is uniform along the closed surface of the third interdielectric layer pattern 112c like the first and second closed via holes h39 and h41. However, the width h42s of the third closed via hole h42 may be nonuniformly wide or narrow. It is preferable that the widths s39, s41, and s42 of the first through third closed via holes h39, h41 and h42 are the same.

The third closed via hole h42 is filled with a conductive material 114c. It is preferable that the conductive material 114c is the same as the conductive materials 114 and 114b filling the first and second closed via holes h39 and h41.

Four fourth open via holes h40 exist between the first closed via hole h39 and the second closed via hole h41. The form of the fourth open via hole 40 is a circle. The fourth open via holes h40 are arranged in the form of a square. It is preferable that the diameters of the fourth open via hole h40 are the same. In other embodiments, the fourth open via holes h40 may be arranged in a form different from a square. The form of the fourth open via holes h40 may be different from a circle, for example, a rectangle, ellipse or a line.

An open via hole may be formed in the second interdielectric layer pattern 112b between the second closed via hole h41 and the third closed via hole h42. Also, fifth and sixth closed or open via holes may be provided in the third interdielectric layer pattern 112c. The fourth open via hole h40 is filled with a conductive material 114a.

As described above, an interdielectric layer shown in FIGS. 3 through 16 may be used for any of the interdielectric layers between the conductive layer patterns forming the multilayer pad. Thus, the interdielectric layer shown in FIGS. 3 through 16 may be the second and/or third interdielectric layers between the first through third conductive layer patterns composing the multilayer pad of FIG. 1.

For instance, the second interdielectric layer 44a between the first and second conductive layer patterns 43a and 46a of FIG. 2 may be selected from the interdielectric layers shown in FIGS. 3 through 16, and the third interdielectric layer 48a existing between the second and third conductive layer patterns 46a and 50a of FIG. 2 may be the interdielectric layer shown in FIG. 14. The second and third interdielectric layers 44a and 48a may be selected from the interdielectric layers of FIGS. 3 through 16. Also, there may be modifications to the embodiments shown in FIG. 3 through 16. For instance, the closed via holes h7 and h8 intersecting with each other of FIG. 6 may be elliptical or one of them may be elliptical.

A method of manufacturing an integrated circuit having a multilayer pad according to the first embodiment of the present invention will be described.

Figure 17:
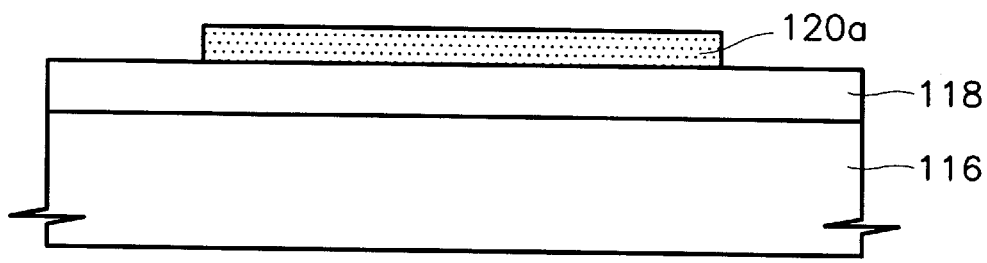
FIGS. 17 through 20 are diagrams showing a method of manufacturing an integrated circuit device having a multilayer conductive pad according to embodiments of the present invention.

FIG. 17 shows the step of forming a first conductive layer pattern on a substrate. In detail, a first interdielectric layer 118 is formed on a semiconductor substrate 116. Semiconductor devices such as transistors and capacitors and a conductive interconnections such as bit lines or gate lines are formed between the first interdielectric layer 118 and the semiconductor substrate 116. A first conductive layer is formed on the first interdielectric layer 118. A photosensitive layer (photoresist) is coated on the first conductive layer, and then the first conductive layer is patterned through a photolithography process. As a result, a photosensitive layer pattern defining a predetermined region of the first conductive layer is formed on the first conductive layer. The entire surface of the first conductive layer is anisotropically etched using the photosensitive layer pattern as a mask until a surface of the first interdielectric layer 118 is exposed. As a result, the first conductive layer pattern 120a is formed on the first interdielectric layer 118.

Figure 18:
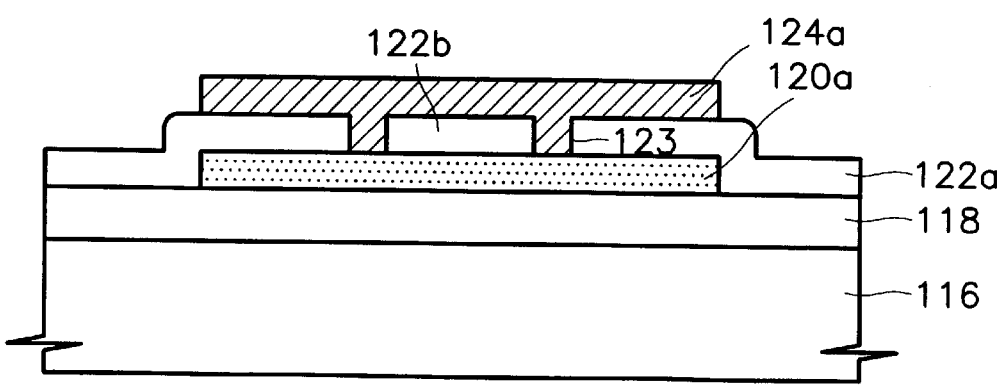

FIG. 18 shows the step of forming a second conductive layer pattern 124a. In detail, the photosensitive layer pattern is removed, and then a second interdielectric layer 122a is formed on the entire surface of the first interdielectric layer 118 and on the first conductive layer pattern 120a. A photosensitive layer is coated on the second interdielectric layer 122a, and a photosensitive layer pattern exposing a portion covering the first conductive layer pattern 120a of the second interdielectric layer 122a is formed on the second dielectric layer 122a. A closed or open via hole is formed on the exposed region of the second interdielectric layer 122a. The photosensitive layer is patterned according to the form of the via hole to be formed on the second interdielectric layer 122a, to thereby define a closed or open exposed region exposing the second interdielectric layer 122a.

The second interdielectric layer 122a is anisotropically etched using the photosensitive layer pattern as a mask until a surface of the first conductive layer pattern 120a is exposed. The photosensitive layer pattern is removed, and a first closed via hole 123 and a second interdielectric layer pattern 122b having a closed circumference surrounded by the first closed via hole 123 are formed on the second interdielectric layer 122a. The photosensitive layer may be patterned in various patterns, so that a multitude of closed or open via holes may be formed outside the first closed via hole 123 of the second interdielectric layer 122a. The open via hole may be shaped in the form of a line or curve. Additional closed via holes may be formed on the second interdielectric layer 122a and the second interdielectric layer pattern 122b. At this time, the additional closed via holes may be elliptical or polygonal.

A second conductive layer pattern 124a filling the first closed via hole 123 is formed on the second interdielectric layer 122a. The second conductive layer pattern 124a is formed parallel to the second interdielectric layer 122a Thus, there preferably is no step between the center of the second conductive layer pattern 124a and the edge thereof. It is preferable that the first and second conductive layer patterns 120a and 124a are formed of the same conductive material. It is also preferable that the thicknesses of the first and second conductive layer patterns 120 and 124a are the same.

Figure 19:
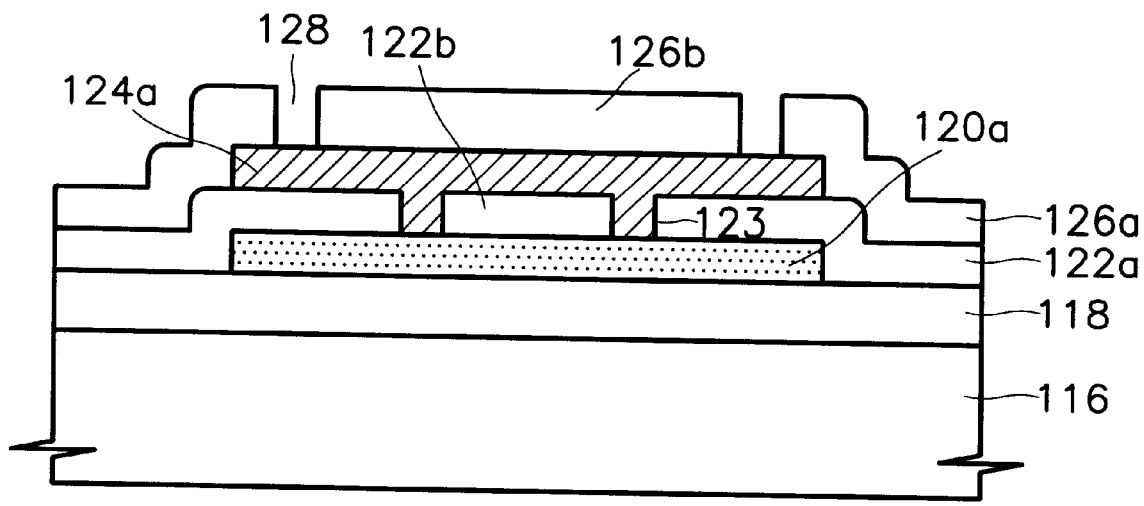

FIG. 19 shows the step of forming a third interdielectric layer 126a including a second closed via hole 128. In detail, a third interdielectric layer 126a is formed on the entire surface of the second interdielectric layer 122a and on the second conductive layer pattern 124a. A photosensitive layer pattern exposing a portion covering the second conductive layer pattern 124a of the third interdielectric layer 126a is formed on the third interdielectric layer 126a. The photosensitive layer pattern preferably is formed such that the exposed portion of third interdielectric layer 126a becomes a closed path. Other closed or open exposed regions may be formed in the photosensitive layer pattern.

The third interdielectric layer 126a is anisotropically etched using the photosensitive layer pattern as a mask until the second conductive layer pattern 124a is exposed. The photosensitive layer pattern is removed, the second closed via hole 128 and the third interdielectric layer pattern 126b surrounded by the second closed via hole 128 are formed on the third interdielectric layer 126a. The second closed via hole 128 may be shaped in various forms like the first closed via hole 123.

If necessary, other closed or open via holes may be further formed on the third interdielectric layer 126a It is preferable that via holes of the same form are shaped in the second and third interdielectric layers 122a and 126a. However, via holes having other shapes may be used. The first and second closed via holes 123 and 128 may be formed according to the same pattern.

Figure 20:
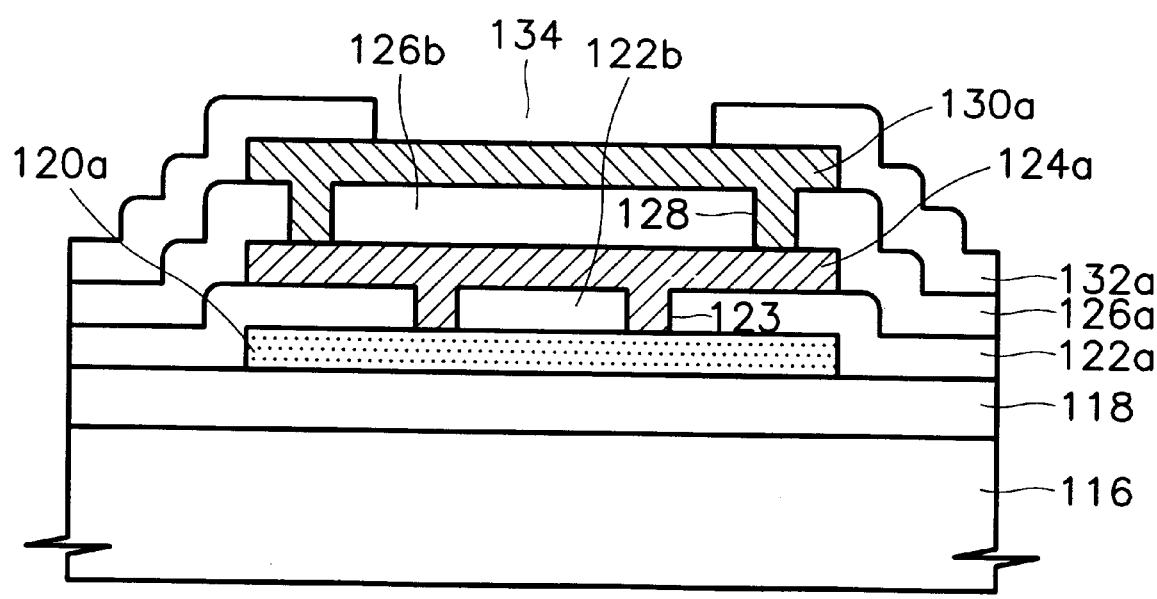

FIG. 20 shows the step of forming a pad window 134. In detail, a third conductive layer pattern 130a filling the second closed via hole 128 is formed on the third interdielectric layer 126a. The third conductive layer pattern 130a is connected to the second conductive layer pattern 124a through the second closed via hole 128. It is preferable that the third conductive layer pattern 130a is formed of the same conductive material as the first or second conductive layer pattern 120a or 124a. It is also preferable that the third conductive layer pattern 130a has the same thickness as the first or second conductive layer pattern 120a or 124a.

As shown in FIGS. 20 and 1, it is preferable that the first through third conductive layer patterns 120a, 124a and 130a are formed of the same thickness. Also preferably, the first and second closed via holes 123 and 128 and other open and closed via holes are filled with a conductive plug such as a tungsten plug, and then the second and third conductive layer patterns 124a and 130s may be formed on the resultant structure.

Subsequently, an upper insulating layer 132a is formed on the entire surface of the entire surface of the third conductive layer pattern 130a A photosensitive layer pattern exposing a portion covering the third conductive layer pattern 130a of the upper insulating layer 132a is formed on the upper insulating layer 132a. The entire surface of the exposed upper insulating layer 132a is anisotropically etched using the photosensitive layer pattern as an etching mask until the third conductive layer pattern 130a is exposed. Then, the photosensitive layer pattern is removed, the pad window 134 exposing the surface of the third conductive layer pattern 130a is formed in the upper insulating layer 132a.

The pad window 134 becomes a bonding area of a multilayer pad comprising the first through third conductive layer patterns 120a, 124a, 130a. It is preferable that the pad window 134 is formed wide enough to reduce contact resistance of the pad window 134 within a range of the third conductive layer pattern 130a. An interdielectric layer and a conductive layer pattern can be formed before forming the pad window 134. If necessary, the pad window 134 may be formed in the second conductive layer pattern 124a without forming the third conductive layer pattern 130a, to thereby reduce the thickness of the multilayer pad.

With reference to FIG. 1, the pad window 134 preferably is formed as a rectangle. However, the pad window 134 may be shaped in various forms, for example, the pad window 134 may be a polygon, a circle or an ellipse.

Figure 21:
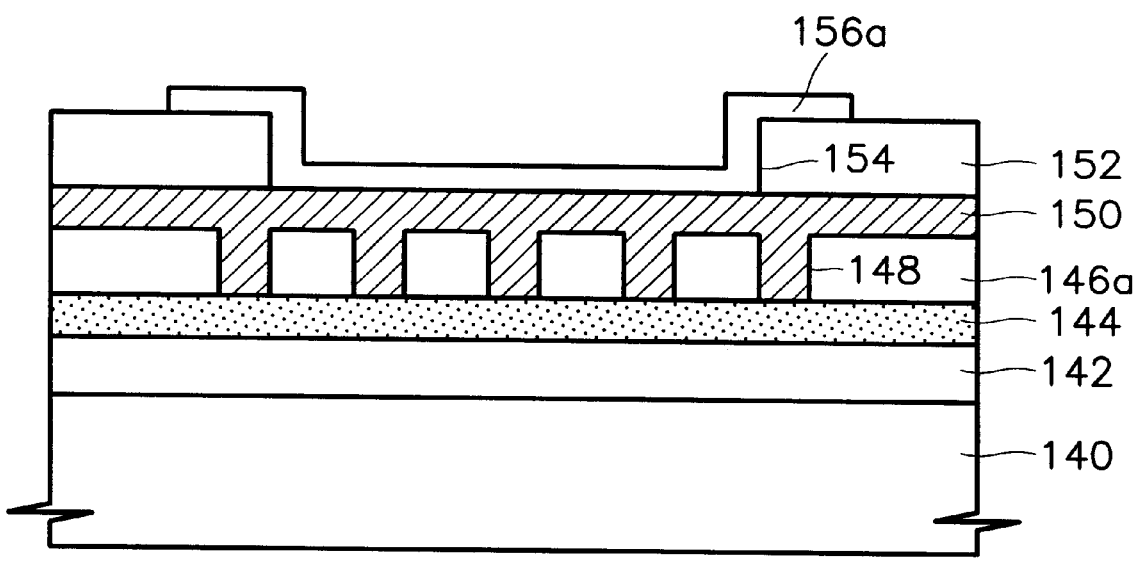
FIG. 21 is a sectional view of an integrated circuit device having a multilayer pad according to a fourth embodiment of the present invention.

FIG. 21 is a sectional view of a semiconductor device having a multilayer pad according to a second embodiment of the present invention. In detail, a first interdielectric layer 142 and a first conductive layer pattern 144 are in sequence formed on a semiconductor substrate 140. A second interdielectric layer 146a including a first via hole 148 is formed on the first conductive layer pattern 144. The first via hole 148 is a closed or open via hole. A second conductive layer pattern 150 filling the first via hole 148 exists on the second interdielectric layer 146a. A third interdielectric layer 152 having a second via hole 154 exists on the second conductive layer pattern 150. The second via hole 154 is a single open via hole. A third conductive layer pattern 156a connected to the second conductive layer pattern 150 through the second via hole 154 exists on the third interdielectric layer 152.

As described above, in a semiconductor device having a multilayer pad according to the second embodiment of the present invention, a closed via hole exists in one of the interdielectric layers between the first through third conductive layer patterns 144, 150 and 156a, and an open via hole exists in another interdielectric layer.

According to the present invention, a bonding pad is composed of multilayer conductive layer patterns, and an interdielectric layer having a closed via hole exists between the multilayer conductive layer patterns. Also, an interdielectric layer pattern having a closed circumference surrounded by the closed via hole exists in the same plane as the interdielectric layer. The conductive layer patterns and the interdielectric layers are parallel with each other, so that there is little or no step between the center and the edge of the conductive layer pattern. Thus, reaction residues generated in the process of etching the interdielectric layer or the conductive layer can be prevented from being stacked between the conductive layer patterns. Alternatively, some reaction residues may be stacked, but the stacked residues can be easily removed during a cleaning process, to thereby lower the resistance of the bonding pad.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A bonding pad for an integrated circuit comprising:
   a first conductive pattern;
   a second conductive pattern on the first conductive pattern and spaced apart therefrom;
   a dielectric layer between the first and second conductive patterns; and
   a closed conductive pattern in the dielectric layer, electrically connecting the first and second spaced apart conductive patterns, the closed conductive pattern enclosing an inner portion of the dielectric layer, and being enclosed by an outer portion of the dielectric layer.

2. A bonding pad according to claim 1 wherein the closed conductive pattern is at least one of a circular, elliptical and polygonal conductive pattern.

3. A bonding pad according to claim 1 fuirther comprising a second closed conductive pattern in the inner portion of the dielectric layer, electrically connecting the first and second spaced apart conductive patterns.

4. A bonding pad according to claim 1 further comprising an open conductive pattern in the inner portion of the dielectric layer, electrically connecting the first and second spaced apart conductive patterns.

5. A bonding pad according to claim 1 further comprising:
   a third conductive pattern that is spaced apart from the second conductive pattern;

a second dielectric layer between the second and third conductive patterns; and a fourth conductive pattern in the dielectric layer, electrically connecting the second and third spaced apart conductive patterns.

6. A bonding pad according to claim 5 wherein the fourth conductive pattern comprises a second closed conductive pattern in the second dielectric layer, electrically connecting the second and third spaced apart conductive patterns, the second closed conductive pattern enclosing a second inner portion of the second dielectric layer, and being enclosed by a second outer portion of the second dielectric layer.

7. A bonding pad for an integrated circuit comprising:

first and second spaced apart conductive patterns and a dielectric layer therebetween; and a closed conductive pattern in the dielectric layer, electrically connecting the first and second spaced apart conductive patterns, the closed conductive pattern enclosing an inner portion of the dielectric layer, and being enclosed by an outer portion of the dielectric layer;

a third conductive pattern that is spaced apart from the second conductive pattern;

a second dielectric layer between the second and third conductive patterns; and a fourth conductive pattern in the dielectric layer, electrically connecting the second and third spaced apart conductive patterns, wherein the fourth conductive pattern comprises a second closed conductive pattern in the second dielectric layer, electrically connecting the second and third spaced apart conductive patterns, the second closed conductive pattern enclosing a second inner portion of the second dielectric layer, and being enclosed by a second outer portion of the second dielectric layer, wherein the second and third conductive patterns are congruent to one another and wherein the closed conductive pattern and the second closed conductive pattern are of same shape but of different sizes.

8. A bonding pad for an integrated circuit comprising:

first and second spaced apart conductive patterns and a dielectric layer therebetween; and a closed conductive pattern in the dielectric layer, electrically connecting the first and second spaced apart conductive patterns, the closed conductive pattern enclosing and inner portion of the dielectric layer, and being enclosed by an outer portion of the dielectric layer;

a third conductive pattern that is spaced apart from the second conductive pattern;

a second dielectric layer between the second and third coductive patterns; and a fourth conductive patter in the dielectric layer, electrically connecting the second and third spaced apart conductive patterns, wherein the fourth conductive pattern comprises a second closed conductive pattern in the second dielectric layer, electrically connecting the second and third spaced apart conductive patterns, the second closed conductive patter enclosing a second inner portion of the second dielectric layer, and being enclosed by a second outer portion of the second dielectric layer, wherein the closed conductive pattern is an elliptical conductive pattern and wherein the second closed conductive pattern is a polygonal closed conductive pattern.

9. A bonding pad for an integrated circuit comprising:

a first conductive pattern;

a second conductive pattern on the first conductive patterns and spaced apart therefrom;

a dielectric layer between the first and second conductive patterns, the dielectric layer including a closed via therein that extends between the first and second spaced apart conductive patterns, the closed via enclosing an inner portion of the dielectric layer, and being enclosed by an outer portion of the dielectric layer; and a closed conductive pattern in the closed via, electrically connecting the first and second spaced apart conductive patterns.

10. A bonding pad according to claim 9 wherein the closed conductive pattern fills the closed via.

11. A bonding pad according to claim 9 wherein the closed via is at least one of a circular, elliptical and polygonal via.

12. A bonding pad according to claim 9 further comprising a second closed via in the inner portion of the dielectric layer; and a second closed conductive pattern in the second closed via, electrically connecting the first and second spaced apart conductive patterns.

13. A bonding pad according to claim 9 further comprising:

an open via in the inner portion of the dielectric layer; and an open conductive pattern in the open via, electrically connecting the first and second spaced apart conductive patterns.

14. A bonding pad according to claim 9 further comprising:

a third conductive pattern that is spaced apart from the second conductive pattern;

a second dielectric layer between the second and third conductive patterns, the second dielectric layer including a second via therein that extends between the second and third spaced apart conductive patterns; and a fourth conductive pattern in the second via, electrically connecting the second and third spaced apart conductive patterns.

15. A bonding pad according to claim 14:

wherein the second via comprises a second closed via in the second dielectric layer that encloses an inner portion of the second dielectric layer, and is enclosed by a second outer portion of the second dielectric layer; and wherein the fourth conductive pattern is a second closed conductive pattern in the second via.

16. A bonding pad for an integrated circuit comprising:

first and second spaced apart conductive patterns and a dielectric layer therebetween, the dielectric layer including a closed via therein that extends between the first and second spaced apart conductive patterns, the closed via enclosing an inner portion of the dielectric layer, and being enclosed by an outer portion of the dielectric layer; and a closed conductive pattern in the closed via, electrically connecting the first and second spaced apart conductive patterns;

a third conductive pattern that is spaced apart from the second conductive pattern;

a second dielectric layer between the second and third conductive patterns, the second dielectric layer including a second via therein that extends between the second and third spaced apart conductive patterns; and a fourth conductive pattern in the second via, electrically connecting the second and third spaced apart conductive patterns, wherein the second via comprises a second closed via in the second dielectric layer that encloses an inner portion of the second dielectric layer, and is enclosed by a second outer portion of the second dielectric layer; and wherein the fourth conductive pattern is a second closed conductive pattern in the second via and wherein the second and third conductive patterns are congruent to one another and wherein the closed conductive pattern and the second closed conductive pattern are of same shape but of different sizes.

17. A bonding pad for an integrated circuit comprising:

first and second spaced apart conductive patterns and a dielectric layer therebetween, the dielectric layer including a closed via therein that extends between the first and second spaced apart conductive patterns, the closed via enclosing an inner portion of the dielectric layer, and being enclosed by an outer portion of the dielectric layer; and a closed conductive pattern in the closed via, electrically connecting the first and second spaced apart conductive patterns;

a third conductive pattern that is spaced apart from the second conductive pattern;

a second dielectric layer between the second and third conductive patterns, the second dielectric layer including a second via therein that extends between the second and third spaced apart conductive patterns; and a fourth conductive pattern in the second via, electrically connecting the second and third spaced apart conductive patterns, wherein the second via comprises a second closed via in the second dielectric layer that encloses an inner portion of the second dielectric layer, and is enclosed by a second outer portion of the second dielectric layer; and wherein the fourth conductive pattern is a second closed conductive pattern in the second via and wherein the closed conductive pattern is an elliptical conductive pattern and wherein the second closed conductive pattern is a polygonal closed conductive pattern.

18. An integrated circuit comprising:

an integrated circuit substrate; and a bonding pad on the integrated circuit substrate, the bonding pad comprising:
  a first conductive pattern on the integrated circuit substrate;
  a second conductive pattern on the first conductive pattern and spaced apart therefrom;
  a dielectric layer between the first and second conductive patterns; and
  a closed conductive pattern in the dielectric layer, electrically connecting the first and second spaced apart conductive patterns, the closed conductive pattern enclosing an inner portion of the dielectric layer, and being enclosed by an outer portion of the dielectric layer.

19. An integrated circuit according to claim 18 wherein the closed conductive pattern is at least one of a circular, elliptical and polygonal conductive pattern.

20. An integrated circuit according to claim 18 further comprising a second closed conductive pattern within the closed conductive pattern, electrically connecting the first and second spaced apart conductive patterns.

21. An integrated circuit according to claim 18 further comprising an open conductive pattern in the dielectric layer, electrically connecting the first and second spaced apart conductive patterns.

22. An integrated circuit according to claim 18 further comprising:
  a third conductive pattern that is spaced apart from the second conductive pattern;
  a second dielectric layer between the second and third conductive patterns; and
  a fourth conductive pattern in the dielectric layer, electrically connecting the second and third spaced apart conductive patterns.

23. An integrated circuit according to claim 22 wherein the fourth conductive pattern comprises a second closed conductive pattern in the second dielectric layer, electrically connecting the second and third spaced apart conductive patterns.

24. An integrated circuit comprising:

an integrated circuit substrate; and a bonding pad on the integrated circuit substrate, the bonding pad comprising:
  first and second spaced apart conductive patterns and a dielectric layer therebetween, on the integrated circuit substrate; and
  a closed conductive pattern in the dielectric layer, electrically connecting the first and second spaced apart conductive patterns;
  a third conductive pattern that is spaced apart from the second conductive pattern;
  a second dielectric layer between the second and third conductive patterns; and
  a fourth conductive pattern in the dielectric layer, electrically connecting the second and third spaced apart conductive patterns wherein the fourth conductive pattern comprises a second closed conductive pattern in the second dielectric layer, electrically connecting the second and third spaced apart conductive patterns and wherein the second and third conductive patterns are congruent to one another and wherein the closed conductive pattern and the second closed conductive pattern are of same shape but of different sizes.

25. An integrated circuit comprising:

an integrated circuit substrate; and a bonding pad on the integrated circuit substrate, the bonding pad comprising:
  first and second spaced apart conductive patterns and a dielectric layer therebetween, on the integrated circuit substrate; and
  a closed conductive pattern in the dielectric layer, electrically connecting the first and second spaced apart conductive patterns;
  a third conductive pattern that is spaced apart from the second conductive pattern;
  a second dielectric layer between the second and third conductive patterns; and
  a fourth conductive pattern in the dielectric layer, electrically connecting the second and third spaced apart conductive patterns, wherein the fourth conductive pattern comprises a second closed conductive pattern in the second dielectric layer, electrically connecting the second and third spaced apart conductive patterns and wherein the closed conductive pattern is an elliptical conductive pattern and wherein the second closed conductive pattern is a polygonal closed conductive pattern.

26. An integrated circuit comprising:

an integrated circuit substrate; and a bonding pad on the integrated circuit substrate, the bonding pad comprising:
- a first conductive pattern on the integrated circuit substrate;
- a second conductive pattern on the first conductive pattern and spaced apart therefrom;
- a dielectric layer between the first and second conductive patterns, the dielectric layer including a closed via therein that extends between the first and second spaced apart conductive patterns, the closed via enclosing an inner portion of the dielectric layer, and being enclosed by an outer portion of the dielectric layer; and
- a closed conductive pattern in the closed via, electrically connecting the first and second spaced apart conductive patterns.

27. An integrated, circuit according to claim 26 wherein the closed conductive pattern fills the closed via.

28. An integrated circuit according to claim 26 wherein the closed via is at least one of a circular, elliptical and polygonal via.

29. An integrated circuit according to claim 26 further comprising:
- a second closed via in the dielectric layer, within the closed via; and
- a second closed conductive pattern in the second closed via, electrically connecting the first and second spaced apart conductive patterns.

30. An integrated circuit according to claim 26 further comprising an open via in the dielectric layer; and
- an open conductive pattern in the open via, electrically connecting the first and second spaced apart conductive patterns.

31. An integrated circuit according to claim 26 further comprising:
- a third conductive pattern that is spaced apart from the second conductive pattern;
- a second dielectric layer between the second and third conductive patterns, the second dielectric layer including a second via therein that extends between the second and third spaced apart conductive patterns; and
- a fourth conductive pattern in the second via, electrically connecting the second and third spaced apart conductive patterns.

32. An integrated circuit according to claim 31:

wherein the second via comprises a second closed via in the second dielectric layer; and wherein the fourth conductive pattern is a second closed conductive pattern in the second via.

33. An integrated circuit comprising:

an integrated circuit substrate; and a bonding pad on the integrated circuit substrate, the bonding pad comprising:
- first and second spaced apart conductive patterns and a dielectric layer therebetween on the integrated circuit substrate, the dielectric layer including a closed via therein that extends between the first and second spaced apart conductive patterns; and
- a closed conductive pattern in the closed via, electrically connecting the first and second spaced apart conductive patterns;
- a third conductive pattern that is spaced apart from the second conductive pattern;
- a second dielectric layer between the second and third conductive patterns, the second dielectric layer including a second via therein that extends between the second and third spaced apart conductive patterns; and
- a fourth conductive pattern in the second via, electrically connecting the second and third spaced apart conductive patterns, wherein the second via comprises a second closed via in the second dielectric layer; and
- wherein the fourth conductive pattern is a second closed conductive pattern in the second via and wherein the second and third conductive patterns are congruent to one another and wherein the closed conductive pattern and the second closed conductive pattern are of same shape but of different sizes.

34. An integrated circuit comprising:

an integrated circuit substrate; and a bonding pad on the integrated circuit substrate, the bonding pad comprising:
- first and second spaced apart conductive patterns and a dielectric layer therebetween on the integrated circuit substrate, the dielectric layer including a closed via therein that extends between the first and second spaced apart conductive patterns; and
- a closed conductive pattern in the closed via, electrically connecting the first and second spaced apart conductive patterns;
- a third conductive pattern that is spaced apart from the second conductive pattern;
- a second dielectric layer between the second and third conductive patterns, the second dielectric layer including a second via therein that extends between the second and third spaced apart conductive patterns; and
- a fourth conductive pattern in the second via, electrically connecting the second and third spaced apart conductive patterns, wherein the second via comprises a second closed via in the second dielectric layer; and
- wherein the fourth conductive pattern is a second closed conductive pattern in the second via and wherein the closed conductive pattern is an elliptical conductive pattern and wherein the second closed conductive pattern is a polygonal closed conductive pattern.

35. A bonding pad according to claim 9, wherein the closed conductive pattern is spaced apart from at least one of the inner portion of the dielectric layer and the outer portion of the dielectric layer.

36. An integrated circuit according to claim 26, wherein the closed conductive pattern is spaced apart from at least one of the inner portion of the dielectric layer and the outer portion of the dielectric layer.

* * * * *